US010014658B1

(12) United States Patent
Norberg et al.

(10) Patent No.: US 10,014,658 B1
(45) Date of Patent: Jul. 3, 2018

(54) SEMICONDUCTOR OPTICAL AMPLIFIER WITH ASYMMETRIC MACH-ZEHNDER INTERFEROMETERS

(71) Applicant: Aurrion, Inc., Goleta, CA (US)

(72) Inventors: Erik Johan Norberg, Santa Barbara, CA (US); John M. Garcia, Santa Barbara, CA (US); Brian Koch, San Carlos, CA (US); Gregory Alan Fish, Santa Barbara, CA (US)

(73) Assignee: Aurrion, Inc., Goleta, CA (US)

( * ) Notice: Subject to any disclaimer, the term of this patent is extended or adjusted under 35 U.S.C. 154(b) by 0 days.

(21) Appl. No.: 15/599,083

(22) Filed: May 18, 2017

Related U.S. Application Data

(63) Continuation of application No. 14/870,711, filed on Sep. 30, 2015, now Pat. No. 9,685,762.

(Continued)

(51) Int. Cl.
| | |
|---|---|
| *H04J 14/02* | (2006.01) |
| *H01S 5/0683* | (2006.01) |
| *H01S 5/068* | (2006.01) |
| *G02B 6/122* | (2006.01) |
| *G02B 6/12* | (2006.01) |

(Continued)

(52) U.S. Cl.
CPC ........ *H01S 5/0683* (2013.01); *G02B 6/12007* (2013.01); *G02B 6/1225* (2013.01); *G02F 1/225* (2013.01); *H01S 5/06804* (2013.01); *H01S 5/3013* (2013.01); *H04J 14/0221* (2013.01); *G02B 2006/12061* (2013.01); *G02B 2006/12138* (2013.01); *G02B 2006/12164* (2013.01); *G02F 2001/212* (2013.01)

(58) Field of Classification Search
CPC .. H01S 5/0683; H01S 5/3013; H01S 5/06804; G02B 6/1225; G02B 6/12007; G02B 2006/12138; G02B 2006/12164; G02B 2006/12061; H04J 14/0221; G02F 1/225; G02F 2001/212
See application file for complete search history.

(56) References Cited

U.S. PATENT DOCUMENTS

| | | | | |
|---|---|---|---|---|
| 6,577,789 B1 * | 6/2003 | Wang | ................. | H04B 10/2941 359/341.1 |
| 6,671,298 B1 * | 12/2003 | Delfyett | ................... | H01S 5/14 372/26 |

(Continued)

OTHER PUBLICATIONS

"U.S. Appl. No. 14/870,711, Non Final Office Action dated Nov. 4, 2016", 11 pgs.

(Continued)

*Primary Examiner* — Danny Leung
(74) *Attorney, Agent, or Firm* — Schwegman Lundberg & Woessner, P.A.

(57) ABSTRACT

Described herein are photonic integrated circuits (PICs) comprising a semiconductor optical amplifier (SOA) to output a signal comprising a plurality of wavelengths, a sensor to detect data associated with a power value of each wavelength of the output signal of the SOA, a filter to filter power values of one or more of the wavelengths of the output signal of the SOA, and control circuitry to control the filter to reduce a difference between a pre-determined power value of each filtered wavelength of the output signal of the SOA and the detected power value of each filtered wavelength of the output signal of the SOA.

13 Claims, 8 Drawing Sheets

Related U.S. Application Data

(60) Provisional application No. 62/057,577, filed on Sep. 30, 2014.

(51) Int. Cl.
  G02F 1/225 (2006.01)
  H01S 5/30 (2006.01)
  *G02F 1/21* (2006.01)

(56) References Cited

U.S. PATENT DOCUMENTS

| | | | |
|---|---|---|---|
| 7,362,498 | B1 | 4/2008 | Li et al. |
| 7,489,876 | B2* | 2/2009 | Fujita ............... H04B 10/291 398/177 |
| 9,800,013 | B2* | 10/2017 | Xiong ................ H01S 3/302 |
| 2002/0024724 | A1* | 2/2002 | Kosaka ............. H01S 3/06754 359/337.13 |
| 2003/0002798 | A1* | 1/2003 | Hatayama ......... G02B 6/12004 385/48 |
| 2005/0226632 | A1* | 10/2005 | Alleston ........... H04B 10/2572 398/152 |
| 2006/0285792 | A1* | 12/2006 | Spillane ............ B82Y 20/00 385/30 |
| 2010/0158532 | A1* | 6/2010 | Goto ................ H04B 10/07955 398/81 |
| 2011/0141552 | A1* | 6/2011 | Ghera .............. H04B 10/2916 359/334 |
| 2011/0164310 | A1* | 7/2011 | Tanaka ............. H01S 5/0612 359/344 |
| 2011/0316413 | A1* | 12/2011 | Ghosh .............. H01L 27/322 313/498 |
| 2012/0121259 | A1* | 5/2012 | Kuwata ........... H04B 10/07955 398/38 |
| 2012/0257272 | A1* | 10/2012 | Yoshida ........... H04B 10/2914 359/344 |
| 2015/0288136 | A1* | 10/2015 | Bolshtyansky .... H04B 10/2916 398/79 |
| 2015/0349911 | A1* | 12/2015 | Otsubo ............. H04L 1/0046 398/79 |
| 2017/0025814 | A1* | 1/2017 | Xiong ............... H01S 3/06754 |

OTHER PUBLICATIONS

"U.S. Appl. No. 14/870,711, Notice of Allowance dated Mar. 13, 2017" 10 pgs.

"U.S. Appl. No. 14/870,711, Response dated Jan. 6, 2017 to Non Final Office Action dated Nov. 4, 2016", 12 pgs.

* cited by examiner

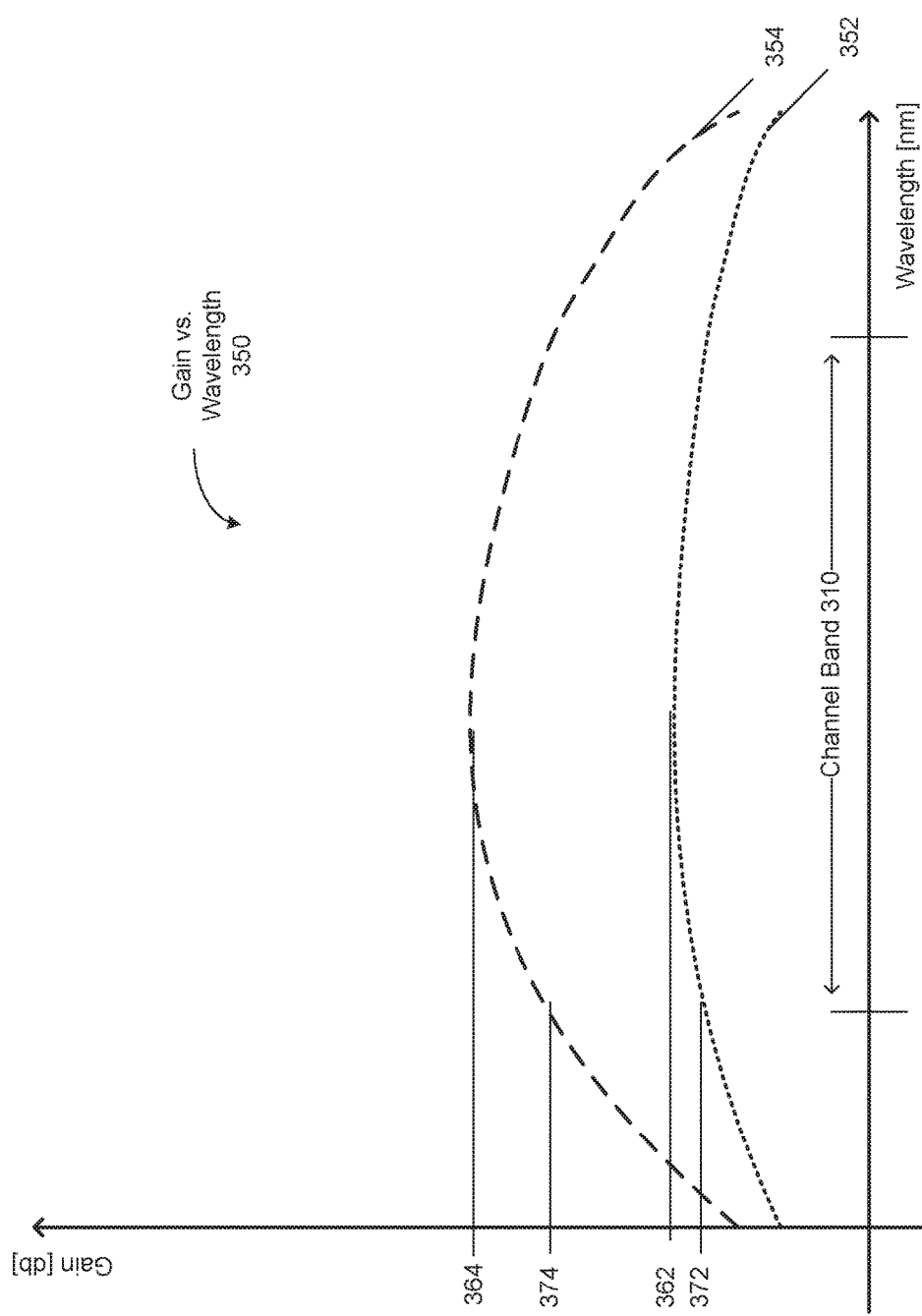

SEMICONDUCTOR OPTICAL AMPLIFIER WITH ASYMMETRIC MACH-ZEHNDER INTERFEROMETERS

CROSS-REFERENCE TO RELATED APPLICATIONS

This application claims the benefit of priority to U.S. patent application Ser. No. 14/870,711, filed Sep. 30, 2015, which claims benefit of priority to U.S. Provisional Patent Application No. 62/057,577, filed Sep. 30, 2014, both of which are hereby incorporated by reference herein in their entirety.

FIELD

Embodiments generally pertain to optical devices and more specifically to optical components included in photonic integrated circuits.

BACKGROUND

Semiconductor optical amplifiers (SOAs) can be found in many wavelength division multiplexing (WDM) systems. SOA devices can experience gain tilt associated with the shift of the gain-spectra that occurs with temperature changes; SOA devices are typically temperature controlled (e.g., heated or cooled) to operate at a constant temperature to avoid this gain-tilt. Temperature controlling SOA devices to operate at a constant temperature utilizes excess power, and the components to control the temperature increases the overall footprint of the devices.

BRIEF DESCRIPTION OF THE DRAWINGS

The following description includes discussions of figures having illustrations given by way of example of implementations and embodiments of the subject matter disclosed herein. The drawings should be understood by way of example, and not by way of limitation. As used herein, references to one or more "embodiments" are to be understood as describing a particular feature, structure, or characteristic included in at least one implementation of the disclosure. Thus, phrases such as "in one embodiment" or "in an alternate embodiment" appearing herein describe various embodiments and implementations of the disclosure, and do not necessarily all refer to the same embodiment. However, such phrases are also not necessarily mutually exclusive.

FIG. 3A and FIG. 3B are illustrations of gain vs. wavelength characteristics for a semiconductor optical amplifier stage and a photonic integrated circuit with dynamic amplification filter control in accordance with some embodiments.

Descriptions of certain details and implementations follow, including a description of the figures, which may depict some or all of the embodiments described below, as well as a description of other potential embodiments or implementations of the concepts presented herein. An overview of embodiments is provided below, followed by a more detailed description with reference to the drawings.

DESCRIPTION

Embodiments of the disclosure describe photonic integrated circuits (PICs) including one or more semiconductor optical amplifiers (SOAs) utilizing one or more gain flattening filters. Throughout this specification, several terms of art are used. These terms are to take on their ordinary meaning in the art from which they come, unless specifically defined herein or unless the context of their use would clearly suggest otherwise. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects of the disclosure.

Figure 1:
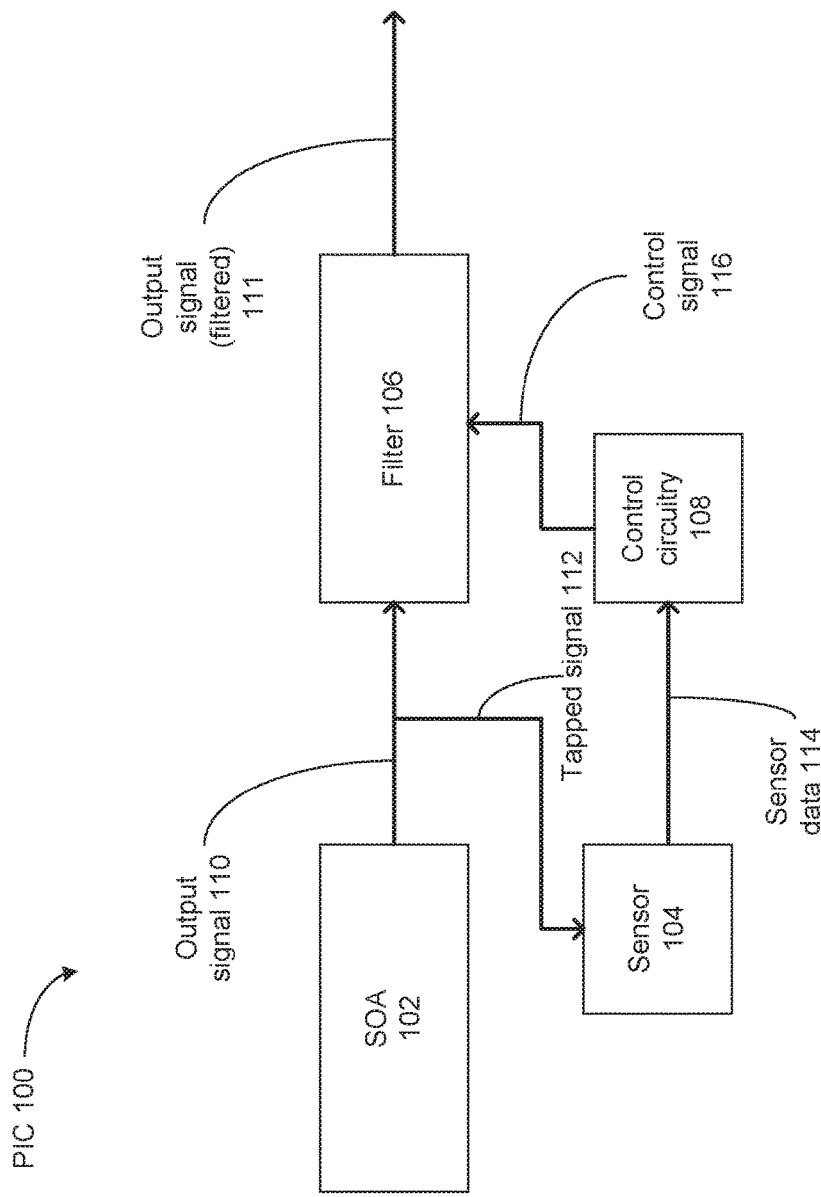
FIG. 1 is an illustration of a photonic integrated circuit in accordance with some embodiments.

FIG. 1 is an illustration of a PIC in accordance with some embodiments. In this embodiment, a PIC 100 is shown to comprise a semiconductor optical amplifier (SOA) 102 to output a signal 110 comprising one or more wavelengths. In this embodiment, the output signal 110 is described as a multi-wavelength signal.

The PIC 100 is further shown to include a sensor 104 to detect data associated with a power value of each wavelength of the output signal 110. In this embodiment, the sensor 104 is illustrated as receiving a tapped optical signal 112 (e.g., tapped from the output signal 110). In some embodiments, the sensor 104 comprises one or more power sensors to directly detect the output power of each wavelength of the output signal 110. For example, the PIC 100 may include a de-multiplexer (e.g., an arrayed waveguide grating (AWG)) to separate the wavelengths of the output signal 110 into a plurality of signals for each wavelength, wherein detectors corresponding to each wavelength may detect a power value of each wavelength of the output signal 110.

In some embodiments, the PIC 100 comprises heterogeneous semiconductor material. For example, the PIC 100 may comprise a silicon on insulator (SOI) substrate; the SOA 102 may comprise a II-V material disposed on the SOI substrate, wherein the SOA 102 and the filter 106 are coupled via a waveguide formed from a silicon material of the SOI substrate. In some of these embodiments, a control circuitry 108 (described in further detail below) is also formed from the silicon material of the SOI substrate. In other embodiments, the control circuitry 108 is separate from the PIC 100.

In other embodiments, the sensor 104 may comprise an electronic sensor (formed, for example, from a silicon material of an SOI substrate of the PIC 100). In these embodiments, the output signal 110 may be modulated to cause the signal to slowly vary (referred to as "dithering"). Electronic sensors may detect a dither amplitude of the tapped signal 112, which may be used to determine power levels of wavelengths of the output signal 110.

In other embodiments, a temperature sensor is utilized (and in some of these embodiments, the optical signal 110 is not tapped), as the PIC 100 may not be temperature controlled (e.g., uncooled). The data associated with a power value of each wavelength of the output signal 110 comprises an operating temperature of the SOA 102 (e.g., power levels of wavelengths of the output signal 110 can be determined based on the operating temperature of the PIC 100).

The PIC 100 is further shown to include a filter 106, which receives the output signal 110. The filter 106 is controllable to filter power values of one or more of the wavelengths of the output signal 110 (shown as filtered output signal 111). In some embodiments, the filter 106 may comprise an active material, such as a III-V material, or a passive material/filter, such as silicon, silicon nitride (SiN), a finite impulse response (FIR) filter, an infinite impulse response filter (IIR), a waveguide based filter, and so forth In some embodiments, the filter 106 comprises an asymmetric Mach Zehnder interferometer (AMZI).

As the temperature of the PIC 100 changes, the gain produced by the SOA 102 may change for at least some of the wavelengths of the output signal 110. This difference in gain of different signal wavelengths of the output signal 110 of the SOA 102 may be described as gain-tilt. The control circuitry 108 is shown to receive data 114 from the sensor 104. The control circuitry 108 controls the filter 106 via one or more control signals 116 to reduce a difference between an expected (or pre-determined) power value of each wavelength of the output signal 110 and the detected power value of each wavelength of the output signal 110. In other words, the control circuitry 108 may dynamically control the filter 106 in response to real-time changes to the power of one or more wavelengths of the output signal 110. The control circuitry 108 may store data, such as a look-up table, including the expected power values of each wavelength of the output signal 110. The control circuitry 108 may also control the gain of the SOA 102 in some embodiments.

Thus, the PIC 100 includes the filter 106 that is dynamically controlled (e.g., via temperature resistive elements) to adjust the gain of the output signal 110 of the SOA 102. Other embodiments may utilize similar processes and components to control a plurality of SOA stages.

Figure 2A:
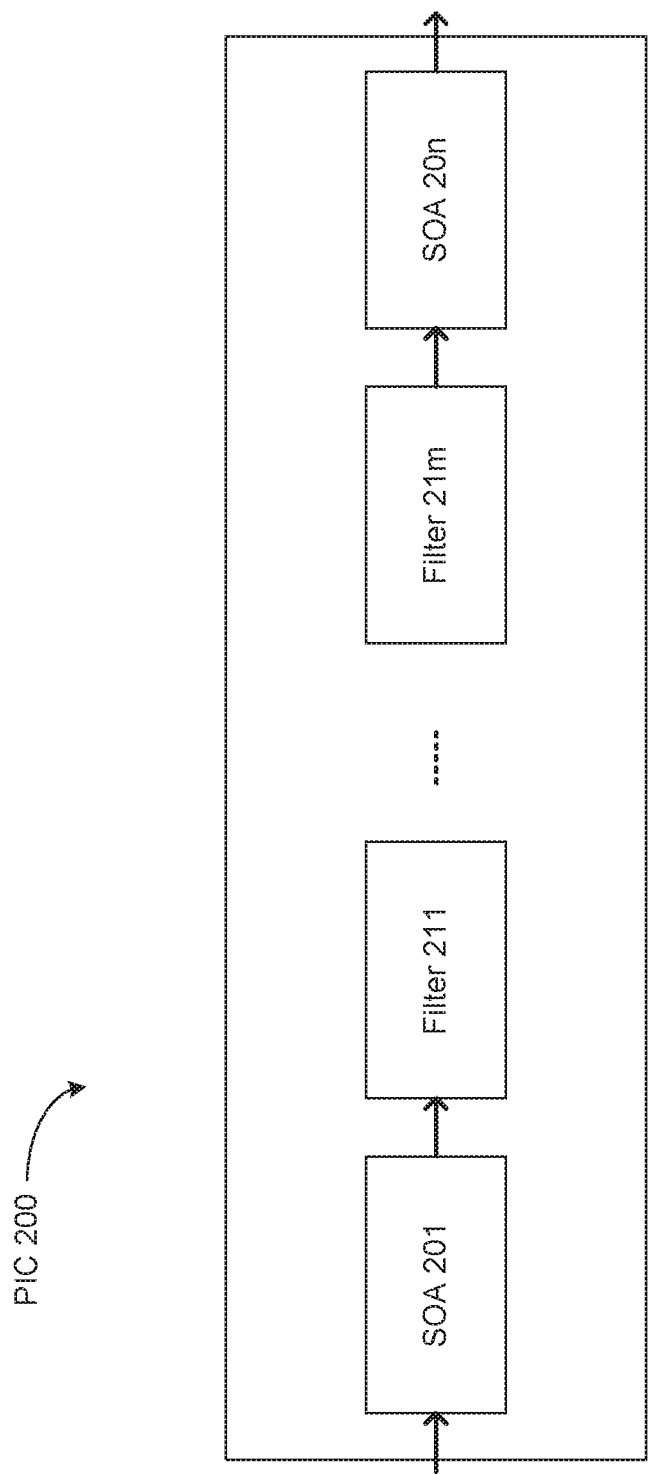
FIG. 2A and FIG. 2B illustrate configurations for a plurality of semiconductor optical amplifier stages and filters in accordance with some embodiments.
Figure 2B:
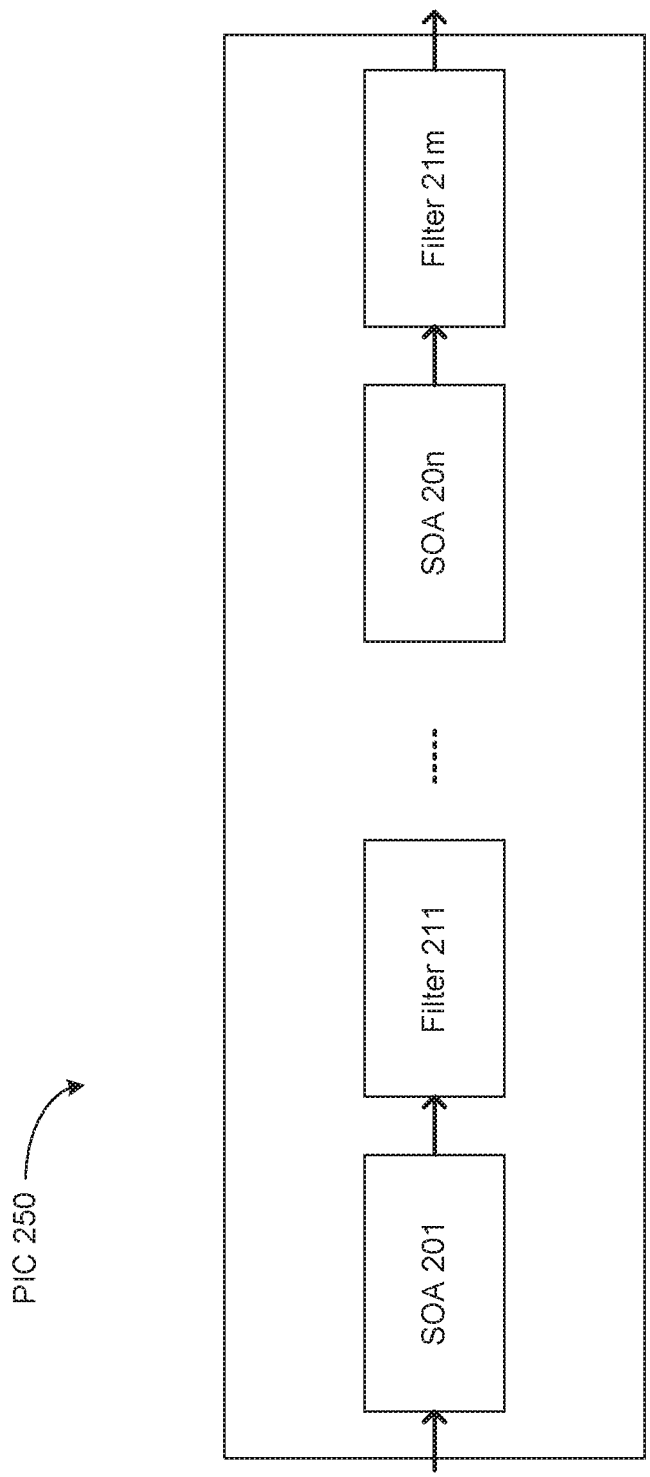

FIG. 2A and FIG. 2B illustrate configurations for a plurality of SOA stages and filters in accordance with some embodiments. FIG. 2A illustrates a PIC 200 including a plurality of SOA stages 201-20n and a plurality of interleaved filters 211-21m, wherein the number of filters is less than the number of SOA stages (i.e., wherein m is less than n, such that the output of filter 21m is received by the SOA stage 20n). FIG. 2B illustrates a PIC 250 including the plurality of SOA stages 201-20n and the plurality of filters 211-21m, wherein the number of filters is equal the number of SOA stages (i.e., wherein m is equal to n, such that the output of the SOA 20n is received by the filter 21m). The plurality of SOA stages 201-20n may be used, for example, when the gain provided by a single SOA stage is insufficient for an intended application of the PICs 200/250.

In some embodiments, at least some of the SOA stages 201-20n comprise different materials. For example, at least some of the SOA stages 201-20n may be made from different epitaxial material in order to help shape the overall gain spectra (e.g., minimize gain-tilt over wavelength/temperature).

In other embodiments, SOA stages and filters may not comprise separate circuitries. For example, in some embodiments, each of a plurality of SOA stages may be included different branches of an AMZI functioning as a filter.

As discussed above, control circuitry (not shown) may be utilized to control the gain of the SOA stages 201-20n and the plurality of wavelength filters 211-21m using data from one or more sensors. The SOA stages 201-20n may be dynamically controlled to produce different gains per stage, and the wavelength filters 211-21m may be dynamically and independent controlled to control the shape of the output of the filters (e.g., the center frequency of each filter).

As discussed above, the output of an SOA region may vary based on its operating temperature. In this embodiment, each of the SOA stages 201-20n provide a gain of an optical signal, and thus may compound a gain-tilt repeatedly. By minimizing this gain-tilt across the channels and providing, for example, a minimum set gain for each channel, the overall power is kept at a minimum at the output of the PICs 200 and 250. This may, for example, reduce output saturation power on the SOA stages 201-20n to avoid signal impairments caused by gain saturation effects.

Figure 3A:
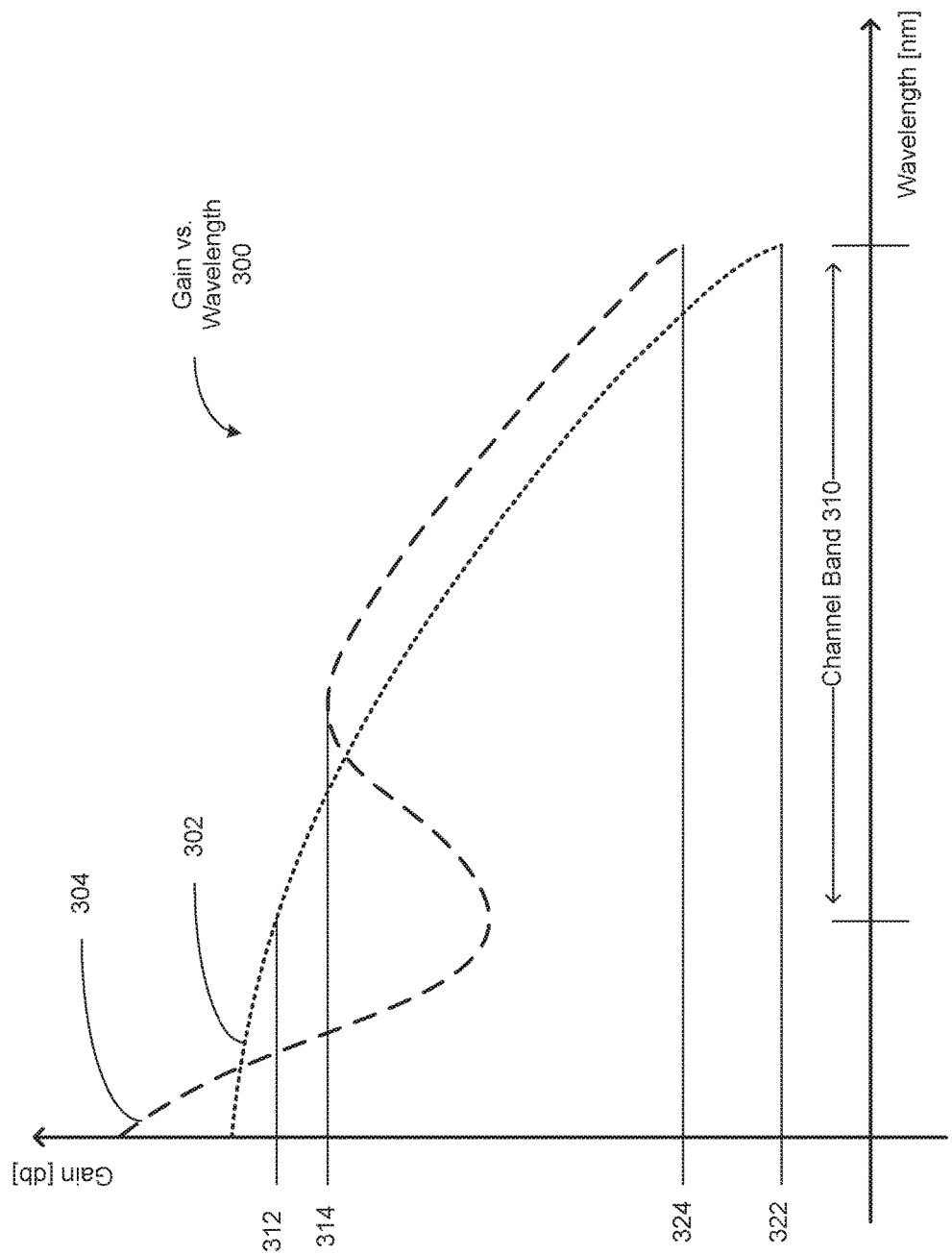

FIG. 3A and FIG. 3B are illustrations of gain vs. wavelength characteristics for an SOA stage and a PIC with dynamic amplification filter control in accordance with some embodiments. For FIG. 3A, a gain vs. wavelength plot 300 at a first temperature is shown to include two data series—a data series 302 associated with a single SOA stage, and a data series 304 associated with a PIC including a plurality of SOA stages and one or more dynamically controlled filters as discussed above. For FIG. 3B, a gain vs. wavelength plot 350 at a second temperature higher than the first temperature referred to in FIG. 3A is shown into include two data series—a data series 352 associated with a single SOA stage, and a data series 354 associated with a PIC including a plurality of SOA stages and one or more dynamically controlled filters as discussed above.

A channel band 310 is illustrating as comprising a wavelength range. The differences in gain across wavelengths in the data series of both FIG. 3A and FIG. 3B illustrates gain tilt. For embodiments comprising a plurality of SOA stages (e.g., as shown in FIG. 2A and FIG. 2B), this gain difference is accumulated throughout the SOA stages. As shown in FIG. 3A, the data series 302 for a single SOA stage has a maximum gain 312 and a minimum gain 322 (this gain tilt would be accumulated throughout a plurality of SOA stages) Furthermore, any excess gain from a single SOA stage operating at the first (cooler) temperature would be accumulated throughout the SOA stages. The data series 304 illustrates that one or more filters may be dynamically controlled (as discussed above) such that the difference between the maximum gain 322 and minimum gain 324 for a plurality of SOA stages is reduced, thereby reducing (or preventing) the accumulated gain tilt and/or excess gain discussed above. For embodiments utilizing a single SOA stage, the associated data series related to a filtered output signal may be similar to that of the data series 304, but with lower gain values than the data series 302 (i.e., the gain values of a single unfiltered SOA stage). Thus, in this example, the technical benefits of this dynamic filter control can be realized for a single SOA stage, but are significantly more realized for multiple SOA stages.

FIG. 3B similarly illustrates the data series data series 352 for a single SOA stage has a maximum gain 362 and a minimum gain 372. The data series 352 is shown to be relatively flat. The data series 354 illustrates the output of a plurality of SOA stages and a filter stage, thereby including higher minimum/maximum values 364/374 over the channel band 310. For embodiments utilizing a single SOA stage, the associated data series related to a filtered output signal may be similar to that of the data series 354, but with lower gain values than the data series 352 (i.e., the gain values of a single unfiltered SOA stage). Thus, in this example, the one or more filters are operated differently at the second temperature compared to the first (cooler) temperature, due to the comparatively stabilized output of each of the SOA stages (e.g., the "flatness" of the data series 352).

Thus, as illustrated in FIG. 3A and FIG. 3B, the gain vs wavelength characteristics inherently shift in wavelength as a function of temperature. While the amplifier gain illustrated by the data series 352 of FIG. 3B for the single SOA stage is centered close to the middle of the channel band 310, the data series 302 of FIG. 3A for the single SOA stage at a cooler temperature illustrates an amplifier gain spectra that is very un-even across the channel band 310. In order to reduce the gain-tilt across the channel band for the entire device, one or more filters are tuned at the first (cooler) temperature to add loss to the part of gain-spectra which sees an excess of gain (e.g., the maximum gain 314 of the data series 304 is reduced across the channel band 310).

Thus, in some embodiments, given some minimum gain value for each of a plurality of channels, the maximum gain-deviation (or gain-tilt, defined as the max difference in gain for any channels in the wavelength division multiplexing (WDM) band) may be minimized. This means that the total optical power in the SOA components is minimized, which helps avoid gain-saturation effects which degrades the signal and/or limits the minimum gain that can be provided for all channels.

Figure 4:
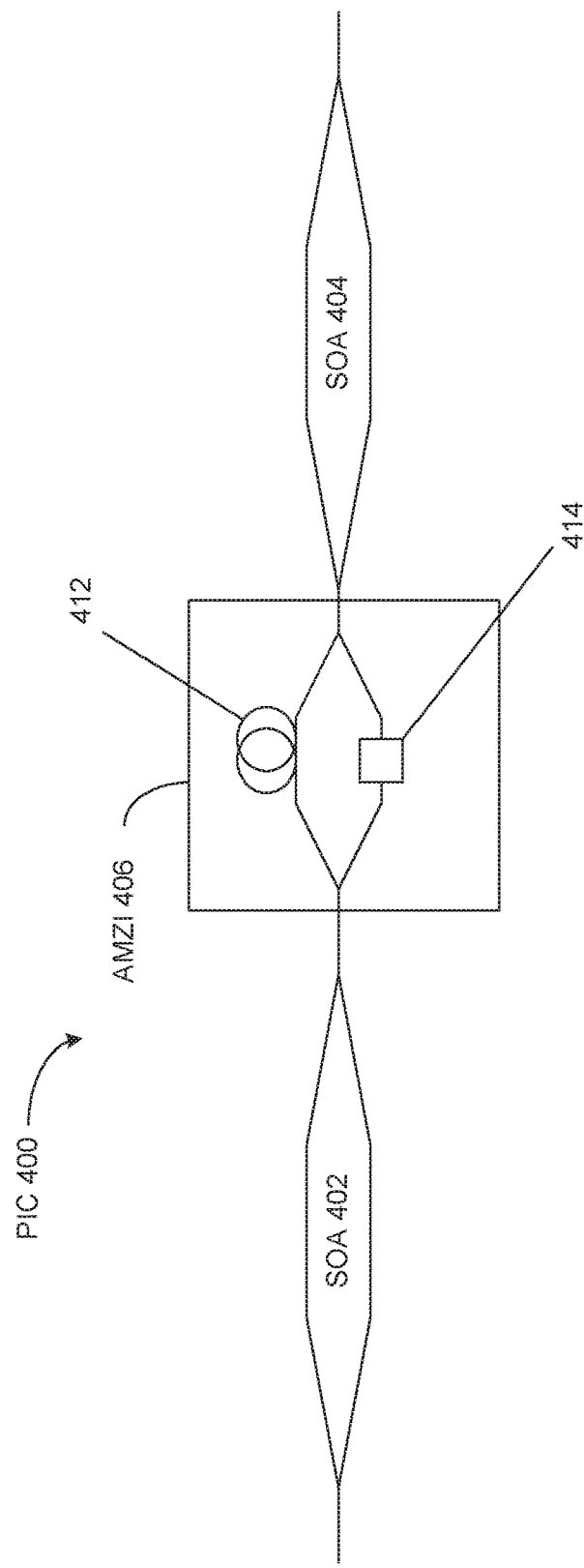
FIG. 4 is an illustration of a multi-stage semiconductor optical amplifier of a photonic integrated circuit in accordance with some embodiments.

FIG. 4 is an illustration of a multi-stage SOA of a PIC in accordance with some embodiments. In this embodiment, a PIC 400 is illustrated to include plurality of SOA stages 402 and 404, and a filter 406 disposed between the SOA stages (coupled, for example, via silicon waveguides in embodiments where the PIC 400 comprises heterogeneous silicon/non-silicon material).

In this embodiment, the filter 406 comprises an AMZI. This AMZI 406 is shown to comprise a waveguide delay 412 and a 414. The AMZI 406 is to provide a zero-filter response to help flatten the output gain-spectra of the SOA stages 402 and 404. In some embodiments, the AMZI 406 comprises a free spectral range (FSR) greater than or equal to a wavelength range of the output signal of the SOA stages 402 and 404.

As discussed above, for embodiments utilizing a plurality of SOA stages, at least some of the SOA stages may be made from different epitaxial material in order to help shape the overall gain spectra (e.g., minimize gain-tilt over wavelength/temperature). For example, in this embodiment, a different peak wavelength (photo-luminance wavelength (PL)) can be used for the SOA 402 and the SOA 404.

In some embodiments, the impact of the added loss of one or more utilized filters to the overall noise figure (NF) is minimized. This may be done in this embodiment, for example, by assuring that the gain of the input SOA stage 402 is significantly larger than the loss of the filter 406 over the entire channel band so that the NF of the input SOA stage 402 is dominating.

The overall noise figure for any wavelength of the output signal of the PIC 400 may be found from the cascaded noise figure equation: $F=F_i+(L)/G_i+(F_o)/[G_i*(1/L)]$, wherein L is the loss associated with the filter 406, $F_i$ and $F_o$ is the noise figure of input SOA stage 402 and the output SOA stage 404, respectively, and $G_i$ is gain of the input SOA stage 402.

Figure 5:
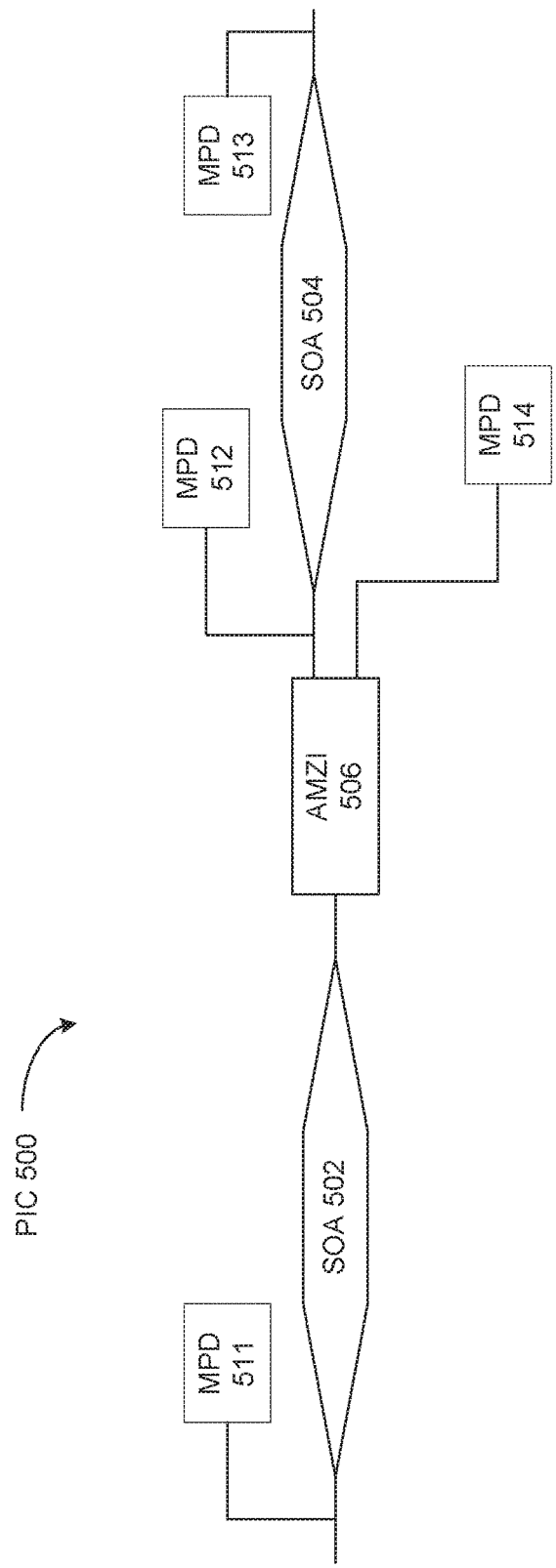
FIG. 5 is an illustration of a semiconductor optical amplifier of a photonic integrated circuit utilizing a plurality of monitor photodiodes in accordance with some embodiments.

FIG. 5 is an illustration of a multi-stage SOA of a PIC utilizing a plurality of monitor photodiodes (MPDs) in accordance with some embodiments. In this embodiment, a PIC 500 is illustrated as including an input SOA stage 502 and an output SOA stage 504. An AMZI 506 functions as a filter disposed between the input SOA stage 502 and the output SOA stage 504.

A plurality of MPDs 511-514 are illustrated to function as multiple tap-detectors to measure photocurrent, and thus power, throughout the illustrated components of the PIC 500. The MPDs 511-514 are used to obtain data for controlling the overall gain shape by means of tuning the gain (individually) of the SOA stages 502 and 504 and the shape of the output of the filter 506 (e.g., the center frequency of each filter).

The MPD 511 is shown tap the optical signal input to the SOA stage 502. The MPDs 512 and 513 are shown to tap the optical signal input and output of the SOA stage 504, respectively. And the MPD 514 is shown to tap the output of one of the outputs of the AMZI 506.

The data used by the MPDs 511-514 may be used for ratiometric control of the SOA stages 502 and 504, and the filter 506—i.e., to control the output of each optical component in response to determining a difference between a measured ratio and a target ratio for data collected by any combination of the MPDs 511-514. In other embodiments, any subset of the MPDs 511-514 (or additional MPDs) may be used for ratiometric control of one or more SOA stages and filters.

Figure 6:
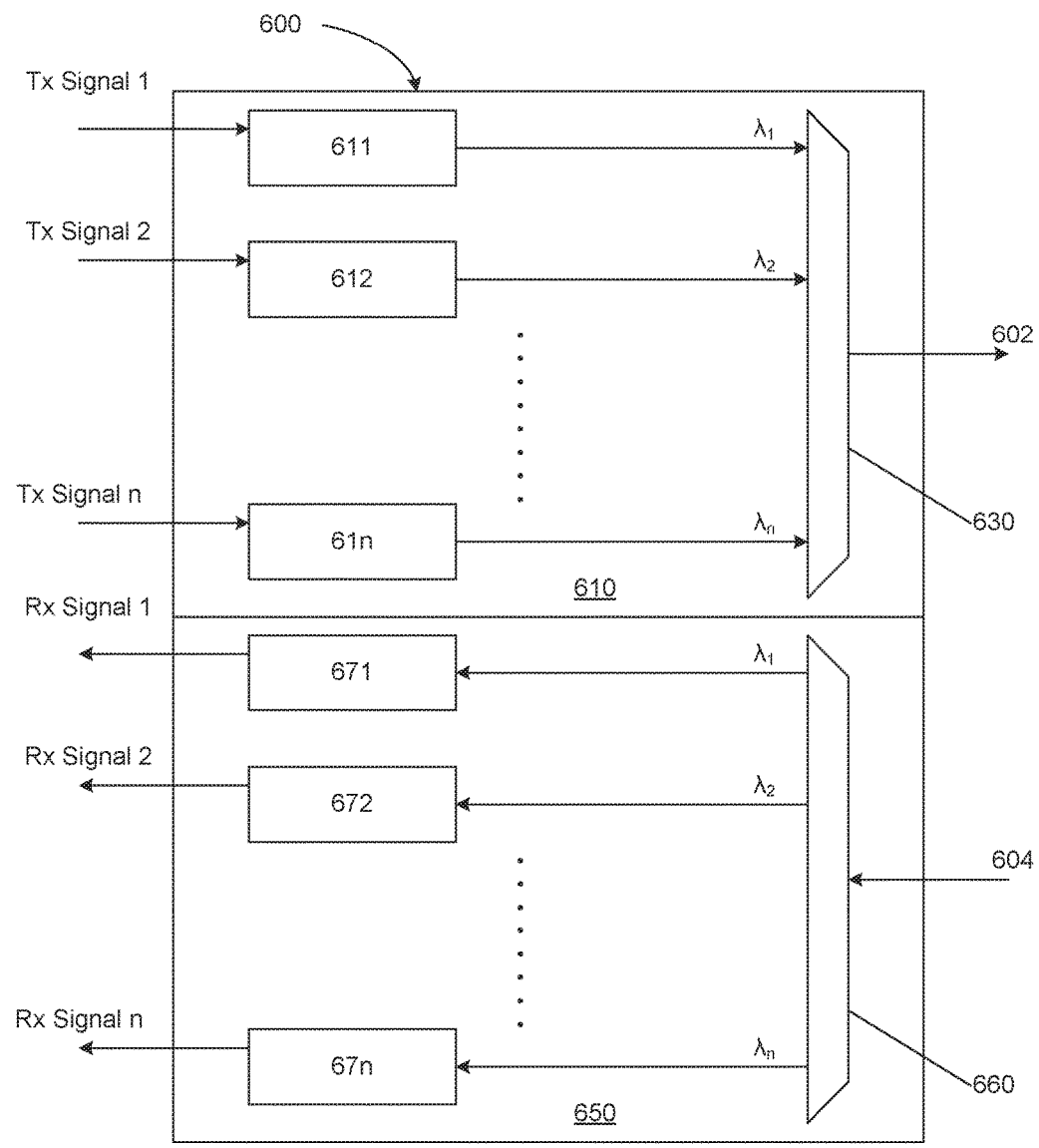
FIG. 6 illustrates a tunable multi-wavelength optical transceiver in accordance with some embodiments.

FIG. 6 illustrates a tunable multi-wavelength optical transceiver in accordance with some embodiments. In this embodiment, a transceiver 600 includes a transmitter module 610 for generating an output WDM signal 602 having n different WDM wavelengths. These different WDM wavelengths can be based, for example, on, the L C and S bands for WDM applications. The transmitter module 600 includes tunable laser modules 611-61n to generate light, which can be further modulated based on transmission signal data. Said laser modules and modulators can be integrated or discrete components (not shown). A multiplexer 630 is shown to receive n modulated signals and outputs a WDM output signal 602 that comprises multiple output channels within a WDM spectral band.

The transceiver 600 further includes a receiver module 650 including a de-multiplexer 660 to receive a WDM input signal 604 and output the received signal at different WDM wavelengths along n different optical paths. It is to be understood that in other embodiments, the transmitter module 610 and the receiver module 650 can be included in separate devices (i.e., a separate transmitter and receiver). In this embodiment, optical detectors 671-67n are included in the n optical paths and convert the de-multiplexed signals of the WDM input signal 604 into n reception data signals for further processing.

In this embodiment, various components of the transmitter module 610 and the receiver module 650 may include any of the above described amplification devices—e.g, one or more SOA stages and one or more filters dynamically controlled in response to real-time changes to the power of one or more wavelengths of an output signal of an amplification device.

Reference throughout the foregoing specification to "one embodiment" or "an embodiment" means that a particular feature, structure, or characteristic described in connection with the embodiment is included in at least one embodiment of the present disclosure. Thus, appearances of the phrases "in one embodiment" or "in an embodiment" in various places throughout the specification are not necessarily all referring to the same embodiment. Furthermore, the particular features, structures, or characteristics can be combined in any suitable manner in one or more embodiments. In addition, it is to be appreciated that the figures provided are for explanation purposes to persons ordinarily skilled in the art and that the drawings are not necessarily drawn to scale. It is to be understood that the various regions, layers, and structures represented in the figures can vary in size and dimensions.

The above described embodiments can comprise silicon on insulator (SOI) or silicon-based (e.g., silicon nitride (SiN)) devices, or can comprise devices formed from both silicon and a non-silicon material. Said non-silicon material (alternatively referred to as "heterogeneous material") can comprise one of rI-V material, magneto-optic material, or crystal substrate material.

III-V semiconductors have elements that are found in group mI and group V of the periodic table (e.g., Indium Gallium Arsenide Phosphide (InGaAsP), Gallium Indium Arsenide Nitride (GaInAsN)). The carrier dispersion effects of III-V-based materials can be significantly higher than in silicon-based materials, as electron speed in III-V semiconductors is much faster than that in silicon semiconductors. In addition, III-V materials have a direct bandgap which enables efficient creation of light from electrical pumping. Thus, III-V semiconductor materials enable photonic operations with an increased efficiency over silicon for both generating light and modulating the refractive index of light.

Thus, III-V semiconductor materials enable photonic operation with an increased efficiency at generating light from electricity and converting light back into electricity. The low optical loss and high quality oxides of silicon are thus combined with the electro-optic efficiency of III-V semiconductors in heterogeneous optical devices; in some embodiments, said heterogeneous devices utilize low-loss heterogeneous optical waveguide transitions between the devices' heterogeneous and silicon-only waveguides.

Magneto-optic materials allow heterogeneous PICs to operate based on the magneto-optic (MO) effect. Such devices can utilize the Faraday effect, in which the magnetic field associated with an electrical signal modulates an optical beam, offering high bandwidth modulation, and rotates the electric field of the optical mode, enabling optical isolators. Said magneto-optic materials can comprise, for example, materials such as iron, cobalt, or yttrium iron garnet (YIG).

Crystal substrate materials provide heterogeneous PICs with a high electro-mechanical coupling, linear electro optic coefficient, low transmission loss, and stable physical and chemical properties. Said crystal substrate materials can comprise, for example, lithium niobate ($LiNbO_3$) or lithium tantalate ($LiTaO_3$).

In the foregoing detailed description, the method and apparatus of the present subject matter have been described with reference to specific exemplary embodiments thereof. It will, however, be evident that various modifications and changes can be made thereto without departing from the broader spirit and scope of the present inventive subject matter. The present specification and figures are accordingly to be regarded as illustrative rather than restrictive.

Embodiments describe a photonic integrated circuit (PIC) comprising a semiconductor optical amplifier (SOA) to output a signal comprising a plurality of wavelengths, a sensor to detect data associated with a power value of each wavelength of the output signal of the SOA, a filter to filter power values of one or more of the wavelengths of the output signal of the SOA, and control circuitry to control the filter to reduce a difference between a pre-determined power value of each filtered wavelength of the output signal of the SOA and the detected power value of each filtered wavelength of the output signal of the SOA.

In some embodiments, the control circuitry is to further control a gain of the SOA. In some embodiments, the sensor comprises a temperature sensor, and the data associated with a gain value of each wavelength of the output signal of the SOA comprises a temperature of the SOA. In some embodiments, the sensor comprises a power detector. In some embodiments, the PIC further comprises a de-multiplexer to de-multiplex the output signal of the SOA into separate signals for each wavelength of the output signal of the SOA, wherein the sensor comprises a plurality of power detectors to correspond to each output of the de-multiplexer.

In some embodiments, the sensor comprises an electronic sensor to detect a dither amplitude of the output signal of the SOA for determining a power value of each wavelength of the output signal of the SOA. In some embodiments, the filter comprises a passive material. In some embodiments, the filter comprises at least one of silicon, silicon nitride (SiN). In some embodiments, the filter comprises a finite impulse response (FIR) filter, or an infinite impulse response filter (IIR). In some embodiments, the filter comprises an asymmetric Mach Zehnder interferometer (AMZI), the AMZI further comprising a free spectral range (FSR) greater than or equal to a wavelength range of the output signal of the SOA. In some embodiments, the PIC further comprises a second SOA, wherein the SOA and the second SOA are included in a first branch and a second branch of the AMZI, respectively.

In some embodiments, the PIC further comprises a second SOA to receive the output of the filter. In some embodiments, the filter comprises III-V semiconductor material. In some embodiments, the PIC further comprises a silicon on insulator (SOI) substrate, wherein the SOA comprises a III-V material disposed on the SOI substrate, the SOA and the filter are coupled via waveguide formed from a silicon material of the SOI substrate, and the control circuitry is formed from the silicon material of the SOI substrate.

Some embodiments describe a wavelength division multiplexed (WDM) device comprising at least one of a transmission component comprising an array of laser modules to produce light having different optical WDM wavelengths onto a plurality of optical paths, and a multiplexer having a plurality of inputs to receive light from each of the plurality of optical paths and to output an output WDM signal comprising the different optical WDM wavelengths, or a receiving component comprising a de-multiplexer to receive an input WDM signal comprising the different optical WDM wavelengths and to output each of the different WDM wavelengths on a separate optical path. In these embodiments, the at least one of the transmission component or the receiving component includes a photonic integrated circuit (PIC) comprising any of the PICs disclosed herein.

The invention claimed is:

1. An optical system, comprising:
    an optical amplifier configured to output an optical signal that includes light at a plurality of wavelengths;
    a sensor configured to detect an optical power value at each wavelength of the optical signal;
    a plurality of asymmetric Mach-Zehnder interferometers configured to apply a controllable loss to each wavelength of the optical signal, each asymmetric Mach-Zehnder interferometer corresponding to a respective wavelength of the optical signal, each asymmetric Mach-Zehnder interferometer having a free spectral range greater than or equal to a wavelength range subtended by the plurality of wavelengths;

control circuitry configured to, for each wavelength of the
plurality of wavelengths:
receive the detected optical power value at each wavelength from the sensor,
determine, for each wavelength, a difference between the detected optical power value and a reference optical power value, and
control operation of the respective asymmetric Mach-Zehnder interferometer to reduce the difference between the detected optical power value and the reference optical power value.

2. The optical system of claim 1, wherein the asymmetric Mach-Zehnder interferometers are arranged in series.

3. The optical system of claim 1, further comprising a de-multiplexer configured to separate the optical signal according to wavelength.

4. The optical system of claim 3, wherein the sensor includes a plurality of detectors, each detector configured to receive light at a corresponding wavelength from the de-multiplexer.

5. The optical system of claim 1, further comprising a lookup table configured to provide the reference optical power values to the control circuitry.

6. The optical system of claim 1, further comprising a multiplexer configured to combine a plurality of input signals, at respective wavelengths of the plurality of wavelengths, to form a multi-wavelength input to the optical amplifier.

7. The optical system of claim 1, further comprising a de-multiplexer configured to separate a multi-wavelength output of the optical filter into a plurality of output signals, at respective wavelengths of the plurality of wavelengths.

8. A method, comprising:
amplifying an optical input signal to form an amplified optical signal that includes light at a plurality of wavelengths;
detecting an optical power value for each wavelength of light from the amplified optical signal;
applying a controllable loss to each wavelength of light from the amplified optical signal with a plurality of asymmetric Mach-Zehnder interferometers arranged in series, each asymmetric Mach-Zehnder interferometer corresponding to a respective wavelength of the optical signal, each asymmetric Mach-Zehnder interferometer having a free spectral range greater than or equal to a wavelength range subtended by the plurality of wavelengths; and
using control circuitry, for each wavelength of the plurality of wavelengths:
receiving, for each wavelength, the corresponding detected optical power value from the sensor,
determining, for each wavelength, a difference between the detected optical power value and a reference optical power value, and
controlling operation of the respective asymmetric Mach-Zehnder interferometer to reduce the difference between the detected optical power value and the reference optical power value.

9. The method of claim 8, wherein the asymmetric Mach-Zehnder interferometers are arranged in series.

10. The method of claim 8, further comprising:
separating the optical signals according to wavelength with a de-multiplexer; and
directing the wavelength-separated signals to respective detectors of a plurality of detectors, each detector configured to receive light at a corresponding wavelength from the de-multiplexer.

11. An optical system, comprising:
a multiplexer configured to combine a plurality of input signals, at respective wavelengths of a plurality of wavelengths, to form a multi-wavelength input;
an optical amplifier configured to amplify the multi-wavelength input and form an optical signal that includes light at the plurality of wavelengths;
a sensor configured to detect an optical power value for each wavelength of the optical signal;
a plurality of asymmetric Mach-Zehnder interferometers configured to apply a controllable loss to each wavelength of light from the optical signal, each asymmetric Mach-Zehnder interferometer corresponding to a respective wavelength of the optical signal, each asymmetric Mach-Zehnder interferometer having a free spectral range greater than or equal to a wavelength range subtended by the plurality of wavelengths;
control circuitry configured to, for each wavelength of the plurality of wavelengths:
receive the corresponding detected optical power value at each wavelength from the sensor,
determine, for each wavelength, a difference between the detected optical power value and a reference optical power value, and
control operation of the respective asymmetric Mach-Zehnder interferometer to reduce the difference between the detected optical power value and the reference optical power value; and
a de-multiplexer configured to separate a multi-wavelength output of the optical filter into a plurality of output signals, at respective wavelengths of the plurality of wavelengths.

12. The optical system of claim 11, wherein the asymmetric Mach-Zehnder interferometers are arranged in series.

13. The optical system of claim 11, further comprising a lookup table configured to provide the reference optical power values to the control circuitry.

* * * * *